United States Patent
Lee et al.

(10) Patent No.: US 7,364,833 B2
(45) Date of Patent: Apr. 29, 2008

(54) PHOTORESIST COMPOSITION FOR ORGANIC LAYER OF LIQUID CRYSTAL DISPLAY, SPIN-LESS COATING METHOD THEREOF, FABRICATION METHOD OF ORGANIC LAYER PATTERN AND LIQUID CRYSTAL DISPLAY FABRICATED USING THE SAME

(75) Inventors: Yeong-beom Lee, Cheonan-si (KR); Seon-su Sin, Cheonan-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 253 days.

(21) Appl. No.: 11/135,343

(22) Filed: May 24, 2005

(65) Prior Publication Data
US 2005/0266339 A1    Dec. 1, 2005

(30) Foreign Application Priority Data
May 25, 2004    (KR)    ............ 10-2004-0037457

(51) Int. Cl.
G03F 7/038 (2006.01)
G03F 7/028 (2006.01)
G03F 7/16 (2006.01)
G03F 7/30 (2006.01)

(52) U.S. Cl. ............... 430/287.1; 430/270.1; 430/319; 430/327; 430/328; 430/905; 430/910

(58) Field of Classification Search ........... 430/287.1, 430/270.1, 328, 319, 327, 905, 910
See application file for complete search history.

(56) References Cited

U.S. PATENT DOCUMENTS
2006/0166114 A1* 7/2006 Lee ..................... 430/7

FOREIGN PATENT DOCUMENTS
WO    WO 2004097522    * 11/2004
WO    WO 2004/107053 A1 * 12/2004

* cited by examiner

Primary Examiner—Richard L. Schilling
(74) Attorney, Agent, or Firm—F. Chau & Associates, LLC

(57) ABSTRACT

The invention relates to a photoresist composition for an organic layer for a liquid crystal display, which may be used for a large-scale substrate, a spin-less coating method using the composition, a method for fabricating an organic layer pattern, and a liquid crystal display having the organic layer pattern. In particular, the liquid crystal display photoresist composition comprises an organic polymer resin having an average molecular weight in the range of about 2,000 to about 20,000, a mixed solvent of ethylene diglycol methylethyl ether (EDM) and a solvent having a vapor pressure lower than the EDM, and a photosensitizer.

24 Claims, 7 Drawing Sheets

PHOTORESIST COMPOSITION FOR ORGANIC LAYER OF LIQUID CRYSTAL DISPLAY, SPIN-LESS COATING METHOD THEREOF, FABRICATION METHOD OF ORGANIC LAYER PATTERN AND LIQUID CRYSTAL DISPLAY FABRICATED USING THE SAME

CROSS-REFERENCE TO RELATED APPLICATIONS

This application claims priority to Korean Patent Application No. 10-2004-0037457 filed on May. 25, 2004 in the Korean Intellectual Property Office, the disclosure of which is incorporated herein by reference in its entirety.

FIELD OF THE INVENTION

This invention relates to a photoresist composition for a liquid crystal display organic layer, and a spin-less coating method thereof. More particularly, this invention is related to a photoresist composition for a liquid crystal display organic layer, which may be used for a large-scale substrate, and a liquid crystal display having an organic layer pattern fabricated by uniformly coating the composition on a substrate.

BACKGROUND

Since the arrival of the picture information age, there has been demand for personalized, space-saving display devices. As a result, a variety of flat display devices, including thin film transistor-liquid crystal displays (TFT-LCD), plasma display panels (PDP), electro-luminescence devices (EL), and the like, have been developed, as a substitute for cathode-ray tubes (CRTs). The TFT-LCD is the main stream of the flat display device field and is based on a combination of a semiconductor technology and a liquid crystal technology utilizing optical properties of liquid crystals whose molecular arrangement varies as an electrical field is applied thereto.

The organic layer pattern that is widely used in manufacturing TFT-LCDs functions as a passivation film for achieving planarization of a TFT structure. In addition, the organic layer is used in forming an organic layer pattern functioning as an insulating layer for minimizing parasitic capacitance between each of pixel electrodes and data lines. With the increasing demand for large-scale TFT-LCD panels, the trend is to use large-scale substrates. Accordingly, development of a new photoresist composition for organic layer exhibiting coating uniformity suitable to form a large-scale substrate is highly demanded. As used herein, "coating uniformity" refers to uniformity in the thickness of photoresist composition for organic layer coated on the substrate, which exerts effects on an aperture ratio, resolution, and line width of a circuit. For example, a difference in reflectivity, which is caused due to a negligible difference in the thickness of organic layer, may cause a defect to the organic layer, which ultimately results in a defective TFT-LCD. In order to overcome this problem, the aperture ratio of the organic organic layer using benzocyclobutyne (BCB) may be increase. However, the cost ineffectiveness of this method makes it highly undesirable.

Therefore, development of a photoresist composition for an organic layer which does not result in defects such as stains or spots generated on an organic layer pattern remaining in a TFT-LCD after being coated and patterned is highly desirable. In addition, a photoresist composition for organic layer that can be minimally coated to the thickness required for attaining of increased durability during subsequent steps and ultimately reducing the manufacturing cost of the TFT-LCD is desirable.

SUMMARY OF THE INVENTION

The invention relates to a photoresist composition for an organic layer of a liquid crystal display. Moreover, the invention also provides spin-less coating methods whereby the photoresist composition for the organic layer may be uniformly coated on a large-scale substrate. The invention also provides methods for forming an organic layer pattern using the photoresist composition for an organic layer and a liquid crystal display employing the organic layer pattern.

According to an aspect of the invention, a photoresist composition for an organic layer includes an organic polymer resin having an average molecular weight in the range of about 2,000 to about 20,000, a mixed solvent of ethylene diglycol methylethyl ether (EDM), a solvent having a vapor pressure lower than the EDM, and a photosensitizer.

A further aspect of the invention relates to a spin-less coating method for fabricating a photoresist composition for an organic layer, which comprises supplying the photoresist composition for organic layer to a nozzle of a spin-less coating apparatus, and spin-lessly coating the photoresist composition for organic layer on the substrate by moving the Is nozzle relative to the substrate while discharging the photoresist composition for an organic layer through the nozzle.

In another aspect, methods for fabricating an organic layer pattern which may comprise forming an organic layer by spin-lessly coating the photoresist composition for an organic layer, and patterning the organic layer is provided.

Additionally, the invention also provides a liquid crystal display having an organic layer pattern formed by the photoresist composition for an organic layer and methods for fabricating an organic layer pattern.

DETAILED DESCRIPTION OF THE INVENTION

Figure 1:
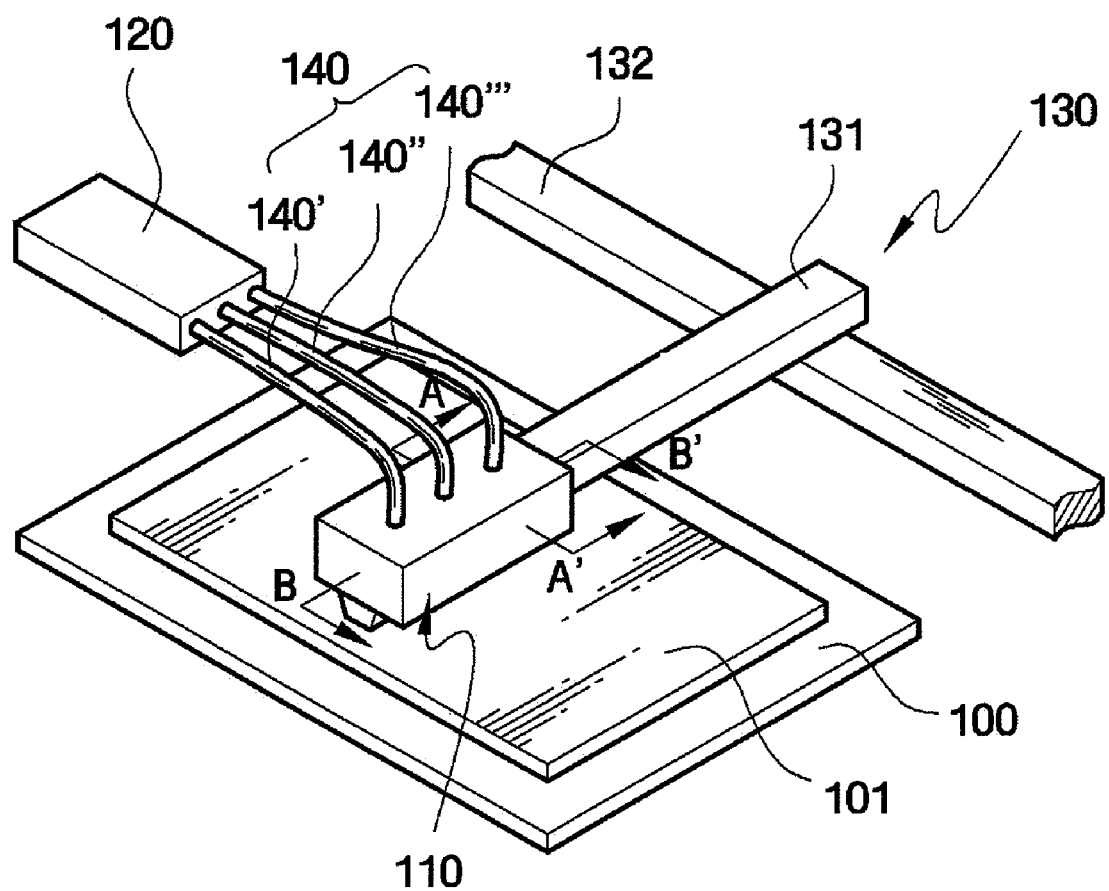
FIG. 1 is a schematic perspective view of a coating apparatus for performing spin-less coating on a photoresist composition for an organic layer according to the invention.

Advantages and features of the invention and methods of accomplishing the same may be understood more readily by reference to the following detailed description of preferred embodiments and the accompanying drawings. The invention may, however, be embodied in many different forms and should not be construed as being limited to the embodiments set forth herein. Rather, these embodiments are provided so that this disclosure will be thorough and complete and will fully convey the concept of the invention to those skilled in the art, and the invention will only be defined by the appended claims. Like reference numerals refer to like elements throughout the specification.

An embodiment of the invention relates to photoresist compositions for an organic layer of a liquid crystal display. The photoresist compositions for the organic layer of the invention are capable of achieving improved coating uniformity on a large-scale substrate. In addition, the photoresist composition for the organic layer according to an embodiment of the invention, are capable of suppressing defects such as stains or spots from remaining in an organic layer pattern after patterning the organic layer pattern.

The organic photoresist film compositions of the invention comprise an organic polymer resin having an average molecular weight in the range of about 2,000 to about 20,000, a mixed solvent of ethyl diglycol methylethyl ethylene diglycol methylethyl ether (EDM) and a solvent having a vapor pressure lower than the EDM, and a photosensitizer.

The organic polymer resin having an average molecular weight in the range of about 2,000 to about 20,000 may comprise, for example, an organic polymer resin represented by Formula 1, an organic polymer resin represented by Formula 2, and mixtures thereof:

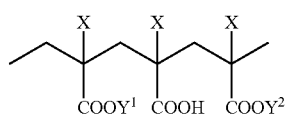

Formula 1 where X may be a hydrogen atom or a methyl group, $Y^1$ may be an alkyl or hydroxyalkyl group having about 2 to about 16 carbon atoms, $Y^2$ may be one or more of the compounds represented by Formulas (I)-(XIX):

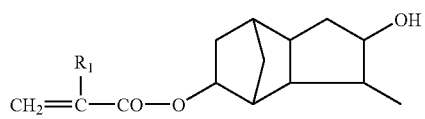

Formula I

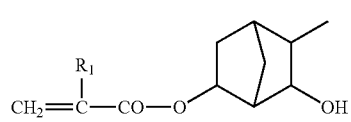

Formula II

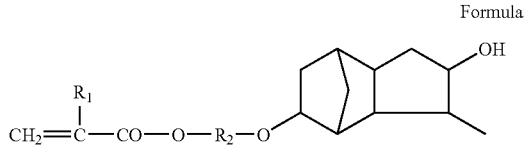

Formula III

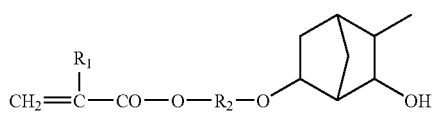

Formula IV

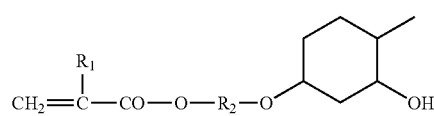

Formula V

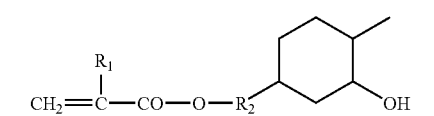

Formula VI

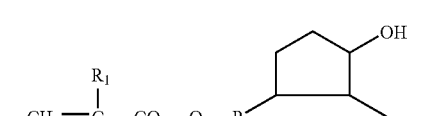

Formula VII

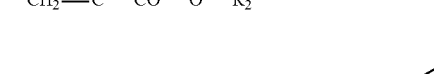

Formula VIII

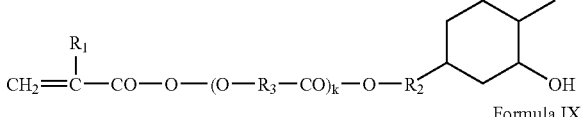

Formula IX

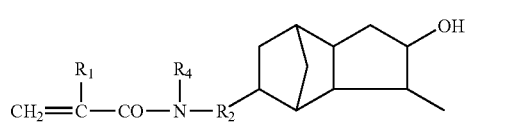

Formula X

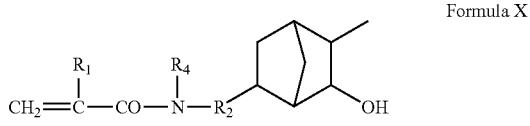

Formula XI

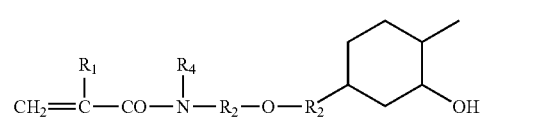

Formula XII

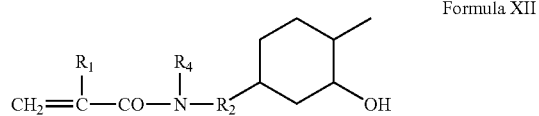

Formula XIII

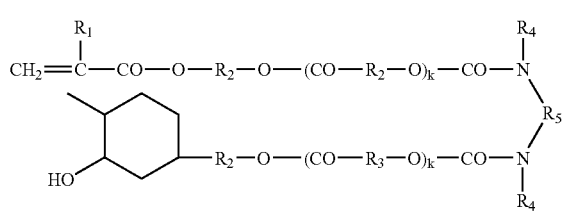

Formula XIV

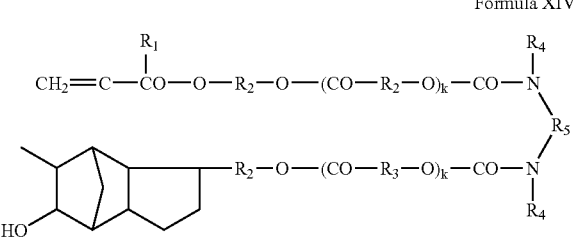

-continued

Formula XV

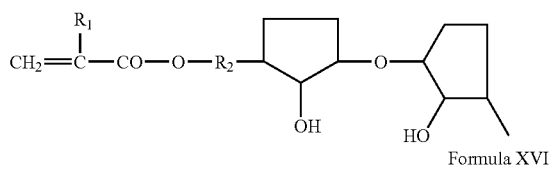

Formula XVI

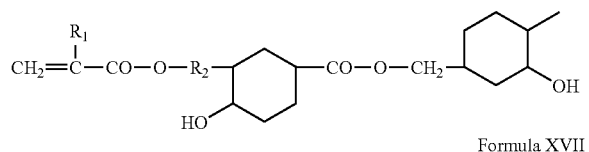

Formula XVII

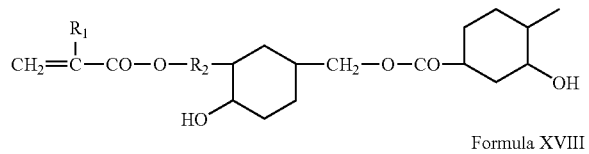

Formula XVIII

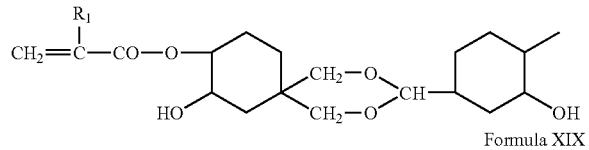

Formula XIX

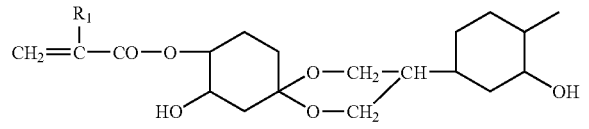

where $R_1$ may be a hydrogen atom or a methyl group, $R_2$ may be an alkylene group of about 1 to about 10 carbon atoms, $R_3$ may be a hydrocarbon residual group of about 1 to about 10 carbon atoms, $R_4$ may be a hydrogen atom or a methyl group, $R_5$ may be an alkylene group of about 1 to about 10 carbon atoms, and k may be an integer of about 0 to about 10.

Formula 2

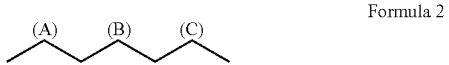

where the polymerization unit A may be benzyl methacrylate (BZMA), styrene (Sty), α-methyl styrene, isobornyl acrylate, or one or more of the compounds comprising isobornyl methacrylate (IBMA), dicyclopentanyl acrylate, dicyclopentanyl methacrylate (DCPMa), dicyclopentenyl acrylate, dicyclopentenyl methacrylate, dicyclopentanylethyloxy acrylate, dicyclopentanylethyloxy methacrylate, dicyclopentenylethyloxy acrylate, and dicyclopentenylethyloxy methacrylate, B may be one or more compounds such as glycidyl methacrylate (GMA), hydroxyethyl methacrylate (HEMA), dimethylamino methacrylate, and acryl amide (ACAMi), C may be acrylic acid (AA) or methacrylic acid (MAA), and the binder resin may comprise random copolymers which are not affected by a sequence in which the polymerization units A, B and C.

The organic polymer resin represented by Formula 1 is a copolymer of a monomer having a carboxyl group and a monomer having a double bond. The composition containing the copolymer according to the invention can attain a pattern having excellent planarization efficiency without defects such as residual traces of remnant after development. In other words, $Y^1$ of Formula 1 may be an alkyl or hydroxyalkyl group having about 2 to about 16 carbon atoms, which promotes an increase in adhesiveness. In addition, $Y^2$ of Formula 1 may include a bulky substituent, which increases the residual film rate and has high heat resistance due to a high glass transition temperature, unlike the organic polymer resin having an acryl copolymer resin containing an aromatic group.

Also, when the organic polymer resin of Formula 2 is used and when the organic polymer resin of Formula 1, substantially the same effects is exhibited. Here, different kinds of polymerization units may be introduced to the organic polymer resin of Formula 2. For example, alkylacrylate or alkylmethacrylate having about 2 to about 16 alkyl groups as represented by D of Formula 3 may be further introduced to the organic polymer resin of Formula 2. More specific examples of such repeating units include methylmethacrylate, butylmethacrylate, laurylmethacrylate, methylacrylate, butylacrylate, laurylacrylate, styrene, and the like:

Formula 3

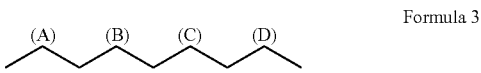

Specifically, the organic polymer resin may be present in an amount in the range of about 5% to about 30% by weight based on the weight of the photoresist composition for the organic layer. When the photoresist composition for the organic layer comprising the amount of the organic polymer resin as describe above is coated on a substrate, the photoresist composition for the organic layer has the required viscosity to coat the substrate with a desired thickness.

In particular, use of a mixture of the organic polymer resin represented by Formula 1 and the organic polymer resin represented by Formula 2 increases compatibility with the photosensitizer contained in the composition, thereby increasing crack resistance of the pattern and preventing whitening.

The photoresist composition for the organic layer according to the invention also comprises a mixed solvent. The mixed solvent may include an ethylene diglycol methylethyl ether (EDM) solvent and a solvent having a vapor pressure lower than the EDM. The EDM is a low-viscosity solvent. That is, when the EDM is mixed with the organic polymer resin in an equal amount, it can lower the viscosity of the composition compared to other solvents. Thus, the EDM is added as a component of the mixed solvent.

Additionally, in order to prevent defects such as stains or spots from remaining on the organic layer pattern, the solvent having a vapor pressure lower than the EDM solvent may also be used as one component of the mixed solvent.

An organic layer pattern may be formed using the photoresist composition for the organic layer using different kinds of solvents with different vapor pressures. The organic layer pattern may be formed by drying under reduced pressure and soft baking to evaporate the solvents used in the organic layer. The drying may be is done under at least two different pressures, which will be described in more detail with respect to a the method for fabricating an organic layer pattern below. During the early drying stage , the solvent having a vapor pressure lower than the EDM solvent is first evaporated followd by evaporating of the EDM solvent. Compared to a composition consisting of a single solvent, using different kinds of solvents with different vapor pressures allows the solvents to be sufficiently evaporated during drying step, thereby preventing any defect (e.g., stains or spots) from being created on the surface of the organic layer.

Representative examples of the solvent having a vapor pressure lower than the EDM may include, but are not limited to, an acetate-based solvent, a lactate-based solvent, a propionate-based solvent, and an ether-based solvent. The acetate solvent may comprise one or more compounds such as propyleneglycol methyl ether acetate (PGMEA), propyleneglycol monomethyl ether acetate (PGMEEA), methoxy butyl acetate (MBA), n-propyl acetate (nPAC), and n-butyl acetate (nBA). Particularly, the acetate-based solvent is preferably propylene glycol methyletheracetate (PGMEA), propylene glycol monoethyletheracetate (PGEEA) or methoxybutylacetate (MBA). Specifically, the lactate-based solvent is ethyl lactate (EL).

In addition, the propionate-based solvent may comprise one or more compounds such as ethyl-beta-ethoxypropionate (EEP) and methyl-3-methoxypropionate (MMP). Particularly, the propionate-based solvent is ethyl-beta-ethoxypropionate (EEP), and the ether-based solvent is propylene glycol monomethyl ether (PGME).

In the invention, the ethylene diglycol methylethyl ether (EDM) may be mixed with the solvent having a vapor pressure lower than the EDM in a ratio in a range of about 50-95 to about 50-5. The mixed solvent within the range above can minimize occurrence of defects on a substrate due to insufficient evaporation of the solvent used, while attaining the viscosity at which a desired coating thickness can be obtained with a minimized amount of the organic polymer resin used, thereby achieving coating uniformity. Consequently, defects that may occur to a TFT-LCD as the end product can be minimized.

The photoresist composition for the organic layer may comprise a photosensitizer. A conventional photosensitizer may be used as the photosensitizer in the photoresist composition for the organic layer of the invention. In regards to transparency and material cost efficiency, however, one or more compounds such as the compounds represented by Formulas 4-6 may be used as the photosensitizer:

Formula 4

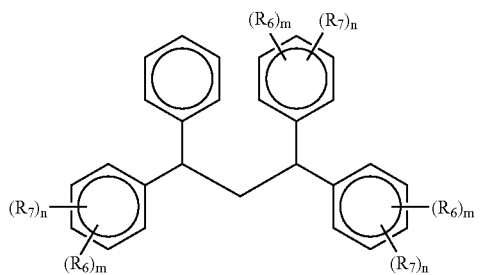

Formula 5

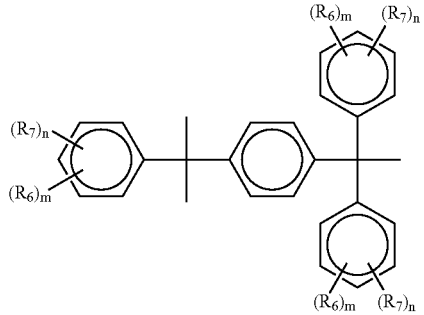

-continued

Formula 6

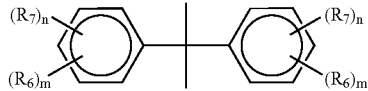

where $R_6$ may be diazonaphthoquinone sulfonic ester (DMQ), $R_7$ may be a hydrogen atom, a hydroxy group, or a methyl group, m and n may independently be about 1 to about 4, the diazonaphthoquinone sulfonic ester (DMQ) is represented by structural formula:

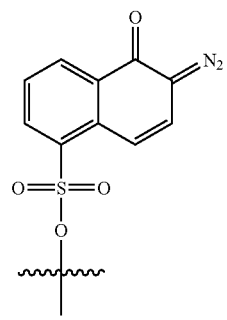

The diazonaphthoquinone sulfonic ester (DMQ) may be obtained by partial esterification or complete esterification whereby 2,1-diazonaphthoquinone-5-sulfonic chloride reacts with a variety of polyphenol compounds or hydroxyl compounds. Such esterification can be efficiently carried out using acetone, dioxane, N-methylpyrrolidone, or mixed solvents thereof in the presence of a basic catalyst such as trialkylamine, e.g., trimethylamine, or triethylamine, sodium carbonate, or sodium bicarbonate.

The above-mentioned compounds have a ballast (polyhydroxy phenol) structure, which is capable of achieving thermal stability and high aperture ratio while exhibiting substantially no light absorption in the vision light area. Diazonaphthoquinone may be introduced to attain a photosensitive property.

In a specific embodiment, the amount of photosensitizer may be in the range of about 2% to about 10% by weight based on the weight of the photoresist composition for the organic layer. By using the photosensitizer in this amount, the photosensitivity may be properly adjusted and the proper residual layer rate may be maintained.

In addition, when necessary, the photoresist composition for the organic layer according to the invention may further comprises additives such as a colorant, a dye, an anti-abrasion agent, a plasticizer, an adhesion promoter, or the like, having a smaller weight molecular weight than the organic polymer resin, thereby achieving enhanced performance owing to characteristics of individual various stages of processing when the photoresist composition for the organic layer coated on the substrate.

In addition to suppress generation of coating defects that may occur to the photoresist composition for the organic layer and improve coating performance, a Si-based surfactant may further be added to the organic photoresist film composition. In particular, the Si-based surfactant is polyalkylene dimethylpolysiloxane copolymer, and is added to the photoresist composition for the organic layer in an amount in the range of about 500 ppm to about 5,000 ppm.

In particular, the photoresist composition for the organic layer may have a viscosity in the range of about 1 cp to about 15 cp. The photoresist composition for the organic layer having the viscosity as described above may be coated on the substrate to a desired thickness.

Coating of the photoresist composition for the organic layer according to the invention may be performed by a general coating method, including roll coating, spin coating, slit-and-spin coating, slit coating, and the like, and more specifically by spin-less coating.

In the spin-less coating method, a photoresist composition for the organic layer may be fed to a nozzle of a spin-less coating apparatus. Then, while the photoresist composition for the organic layer is discharged through the nozzle, the nozzle may move over the substrate, specifically in a unidirectional manner, without spinning the substrate, followed by coating an organic layer on the substrate. The spin-less coating apparatus is disclosed fully in Korean Patent Publication No. 2004-0102521, and is incorporated herein by reference in entirety. The spin-less coating apparatus will first be briefly described with reference to FIGS. 1, 2 and 3, and a spin-less coating method using the apparatus will then be described in more detail.

Referring to FIG. 1, the spin-less coating apparatus includes a pedestal 100 on which the substrate 101 is mounted, a nozzle 110 used to coat the composition on the substrate 101 mounted on the pedestal 100, means 120 for supplying the composition to the nozzle 110, and a moving means 130 for relatively moving the nozzle 110 and the substrate 101.

The supplying means 120 supplies photoresist composition for the organic layer to the nozzle 110 with a pressure of 1-2 kgf/cm² using a pressure discharge method. The supplying means 120 adjusts the composition with high precision in view of concentration and temperature.

In an exemplary embodiment, as shown in FIG. 1, the relatively moving means 130 of moving the nozzle 110 and the substrate 101 with respect to each other includes an arm 131 and a guide rail 132. The nozzle 110 is detachably installed at an end of the arm 131 and is connected to the arm 131 having the guide rail 132 connected to its one end. The nozzle 110 moves along the guide rail 132 by means of a controller (not shown).

Figure 2:
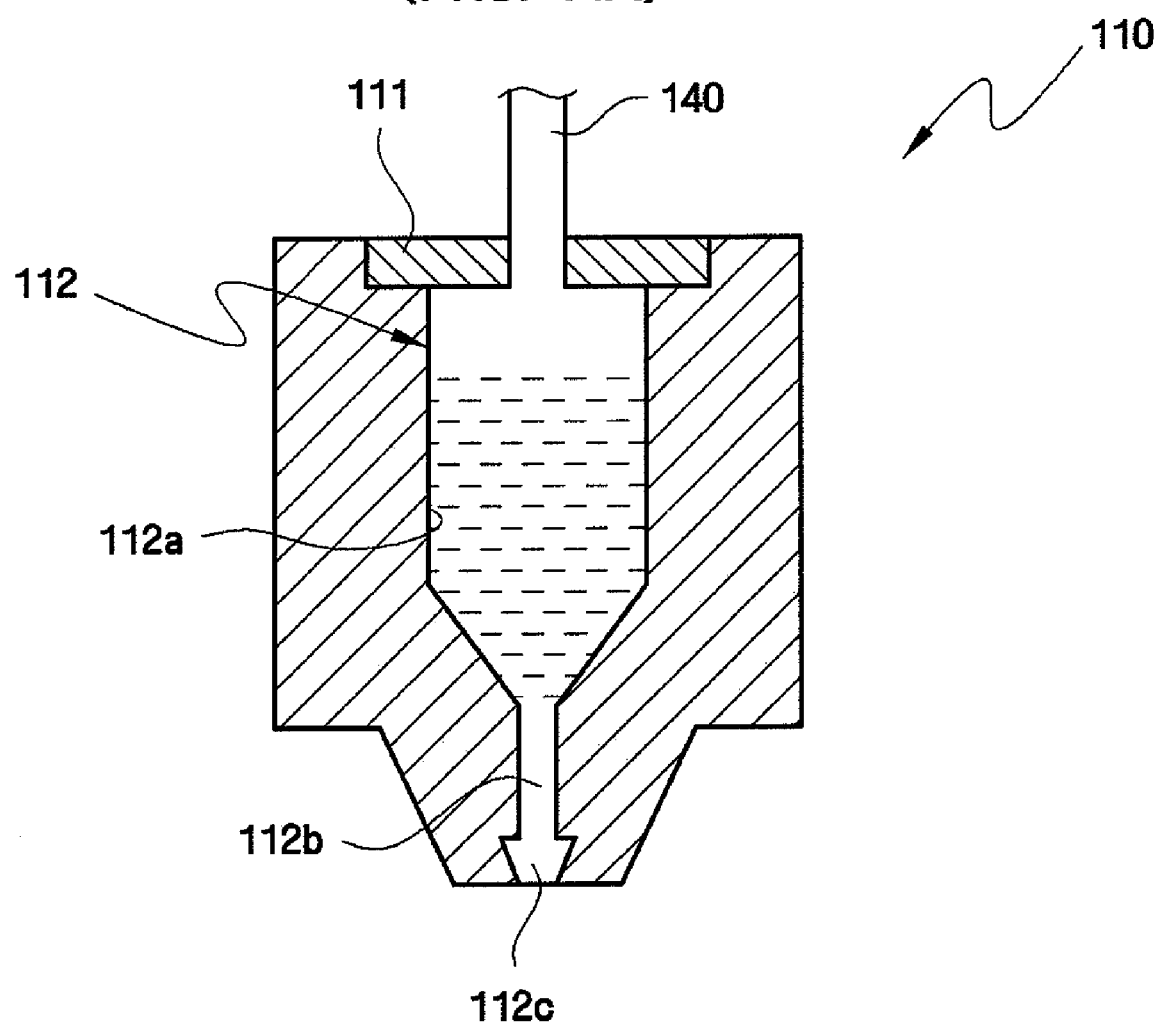
FIG. 2 is a front sectional view of a nozzle shown in FIG. 1 taken along the line A-A'.

As shown in FIG. 2, when viewed from the front of the nozzle 110, a body of the nozzle 110 is shaped of a rectangular box, and an upper portion of the body of the nozzle 110 is covered with a lid 111. A discharge portion 112 is formed within the body of the nozzle 110. The discharge portion 112 includes a supply duct 140 connected to the supplying means 120 of the photoresist composition for the organic layer, a storage portion 112a for storing the composition supplied from the supply duct 140, a passage 112b connected to a bottom of the storage portion 112a, and a slit portion 112c connected to the passage 112b.

Figure 3:
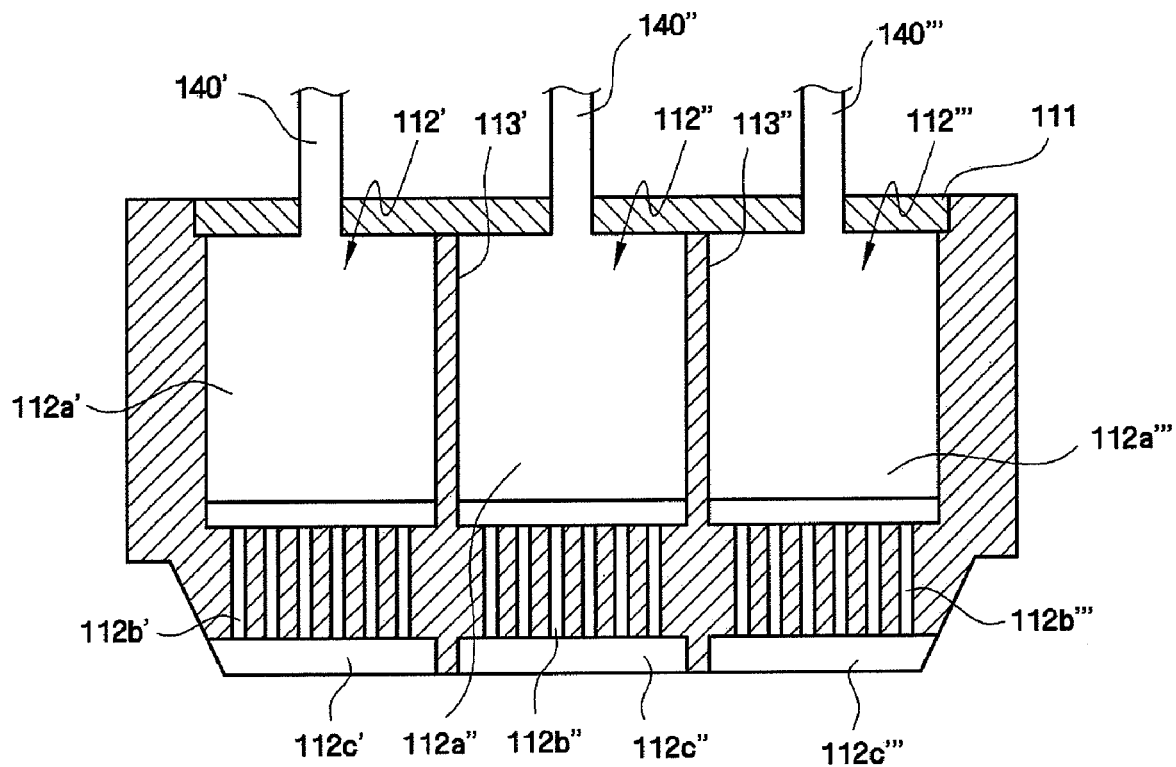
FIG. 3 is a side sectional view of a nozzle shown in FIG. 1 taken along the line B-B'.

When viewed from the side of the nozzle 110, the nozzle 110 may include a single or a plurality of discharge portion(s) 112 or 112', 112", and 112'''. FIG. 3 illustrates that the nozzle 110 includes three discharge portions by way of example. The plurality of discharge portions 112', 112", 112''' include supply ducts 140', 140", 140''' connected to the supplying means 120 of the photoresist composition for the organic layer, storage portions 112a', 112a'', 112a''' for storing the composition supplied from the supply ducts 140', 140", 140''', passages 112b', 112b", 112b''' connected to bottoms of the storage portions 112a', 112a", 112a''', and slit portions 112c', 112c", 112c''' connected to the passages 112b', 112b112b''', respectively. Barriers 113', 113" are formed between each of the discharge portions 112', 112", 112''' and spaced apart from each other. Here, in a case where the discharge portion 112 includes a plurality of discharge portions 112', 112", 112''', the supplying means 120 may supply a single kind of an photoresist composition for the organic layer, or may be connected to a plurality of supply ducts to supply multiple kinds of photoresist compositions for the organic layer. In addition, to supply various kinds of compositions, a plurality of supplying means may be provided. Otherwise, a composition supply duct may be connected to each supplying means.

A spin-less coating method of the photoresist composition for the organic layer according to an embodiment of the invention will now be described. First, the composition may be fed to the supplying means 120 of the spin-less coating apparatus shown in FIGS. 1, 2 and 3. Thereafter, the composition may be transferred to the discharge portion 112 provided within the body of the nozzle 110 through the supply duct 140 with a pressure of 1-2 kgf/cm² using a pressure discharge method. The composition in the discharge portion 112 in the nozzle 110 and supplied from the supplying means 120 through the supply duct 140 is temporarily stored in the storage portion 112a, 112a', 112a", 112a'''. The composition temporarily stored in the storage portion 112a, 112a', 112a", 112a''' may be transferred to the slit portion 112c, 112c', 112 112c''' through the passage 112b, 112b', 112b", 112b''' connected to the bottom of the storag portion 112a, 112a', 112a", 112a''' to then be coated on the substrate 101 through the slit portion 112c, 112c', 112c", 112c'''. Subsequently, in order to perform the coating on the substrate 101 in a desired direction, the nozzle 110 connected to the guide rail 132 may be moved by means of the arm 131, so that the photoresist composition for the organic layer can be uniformly coated over the substrate 101.

The photoresist composition for the organic layer can be advantageously used for forming an organic layer pattern of an LCD.

Figure 4:
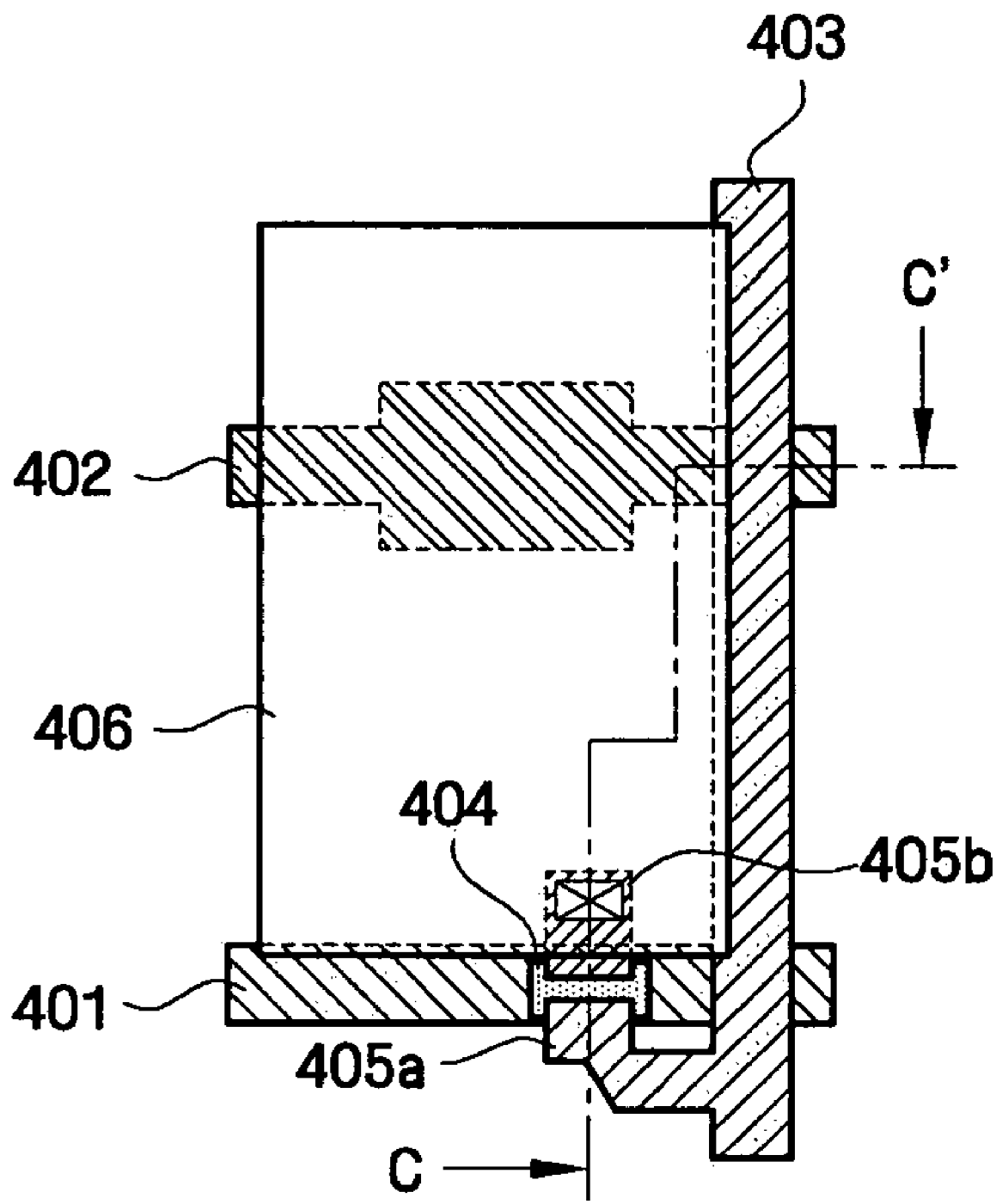
FIG. 4 is a plan view of a unit cell of a thin film transistor liquid crystal display (TFT-LCD) having an organic layer using a photoresist composition according to the invention.

As shown in FIG. 4, a gate line 401 may be arranged in a horizontal direction, and a storage electrode line 402 may be arranged in parallel with and spaced a predetermined distance apart from the gate line 401. A data line 403 may be arranged in a vertical direction to be orthogonal to the gate line 401 and the storage electrode line 402.

In addition, a semiconductor layer 404 may be patterned on the gate line 401 adjacent to an intersection of the gate line 401 and the data line 403. A drain electrode 405a drawn from the data line 403 and a source electrode 405b may be formed at the same time with the data line 403 face each other on the semiconductor layer 404 to be partially overlapped with each other.

Further, a pixel electrode 406 made of indium tin oxide (ITO) may be arranged in a pixel area defined by the gate line 401 and the data line 403. Here, the pixel electrode 406 may be arranged over the pixel area such that it contacts the source electrode 405b and partially overlaps with the data line 403 and the gate line 402.

Figure 5:
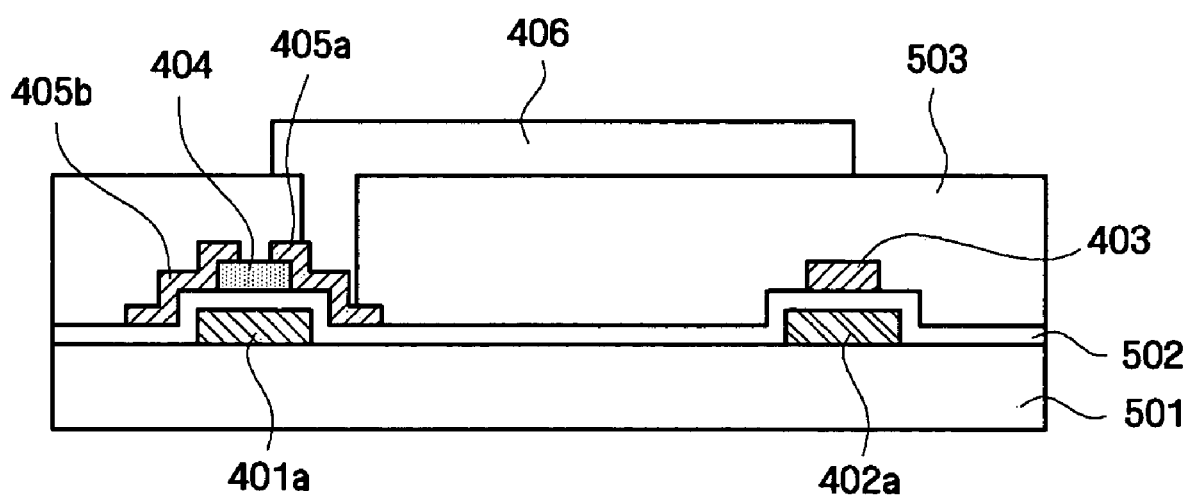
FIG. 5 is a cross-sectional view of a nozzle shown in FIG. 1 taken along the line C-C' shown in FIG. 4.

Referring to FIG. 5, a gate electrode 401a may be formed on a lower substrate 501, a storage electrode 402a is spaced a predetermined distance apart from the gate electrode 401a, and a gate insulating layer 502 is formed over the entire surface of the lower substrate 501. In addition, the semiconductor layer 404 may be formed on the insulating layer 502 disposed on the gate electrode 401a in a pattern form by a known patterning technique. The drain electrode 405a and the source electrode 405b may beformed at the same time with the data line 403 may be formed on semiconductor layer 404 to be spaced apart from each other.

An organic layer pattern 503 may be formed over the entire surface of the lower substrate 501 having the resultant structure through coating of the composition according to the invention. The organic layer pattern 503 may include a contact hole exposing the source electrode 405b. The pixel electrode 406 may then be formed, the pixel electrode 406 contacting the source electrode 405b through the contact hole formed in the organic layer pattern 503 and partially overlapping with the gate electrode 401a and the data line 403. Here, the organic layer pattern 503 functions as both a passivation film and an insulator between the pixel electrode 406 and the data line 403. Alternatively, the organic layer pattern 503 may be formed by coating the organic photoresist film composition according to the invention on a TFT-LCD substrate by the above-described spin-less coating method to form an organic layer, followed by patterning the organic layer.

The The photoresist composition for the organic layer is coated on the TFT-LCD substrate 101 having the gate insulating layer 502, the data line 403, the semiconductor layer 404, the drain electrode 405a and the source electrode 405b. Accordingly, the The photoresist composition for the organic layer can be coated on a variety of materials, including, but is not limited to, siliconoxide (SiOx), silicon nitride, doped siliconoxide, silicon, aluminum, indium tin oxide (ITO), indium zinc oxide (IZO), molybdenum, nitride, tantalum, copper, polysilicon, ceramic, a mixture of aluminum and copper.

As described above, the photoresist composition for the organic layer is coated on the substrate 101 by the spin-less coating method, thereby forming the organic layer.

Subsequently, the organic layer pattern 503 is formed on the resultant structure by a process including drying the organic layer on the substrate under reduced pressure, soft baking the dried organic layer, selectively exposing the soft-baked organic layer, developing the organic layer, and curing the developed organic layer.

The steps of forming the organic layer pattern will now be described in more detail. First, the organic layer on the substrate is dried under reduced pressure, thereby evaporating about 80% to about 90% of the solvent contained in the organic layer.

The dry step may comprise pre-pumping and main pumping, which are sequentially conducted. The pre-pumping may be slowly conducted so as to pump a decompression dry device with the pressure of about $10^{-5}$ Pa whereas the main pumping may be conducted faster than the pre-pumping so as to pump the decompression dry device with the pressure of about 66.66 Pa, so that the decompression dry device has a pressure lower than the pre-pumping. In the pre-pumping, a solvent having a vapor pressure lower than EDM solvent may be first evaporated and the EDM solvent may be mainly evaporated in the main pumping.

Compared to a composition consisting of a single solvent, using different kinds of solvents with different vapor pressures allows the solvents to be sufficiently evaporated during the drying step, thus preventing any defect (e.g., stains or spots) from being created on the surface of the organic layer.

Thereafter, the dried organic layer is soft baked. Generally under the soft baking, any residual solvent remaining from the drying step may be completely evaporated, and the organic layer may be solidified. Particularly, the soft baking may be performed at a temperature in a range of about 80° C. to about 120° C. until the organic layer on the substrate has a thickness in the range of about 2 μm-10 μm.

Figure 6A:
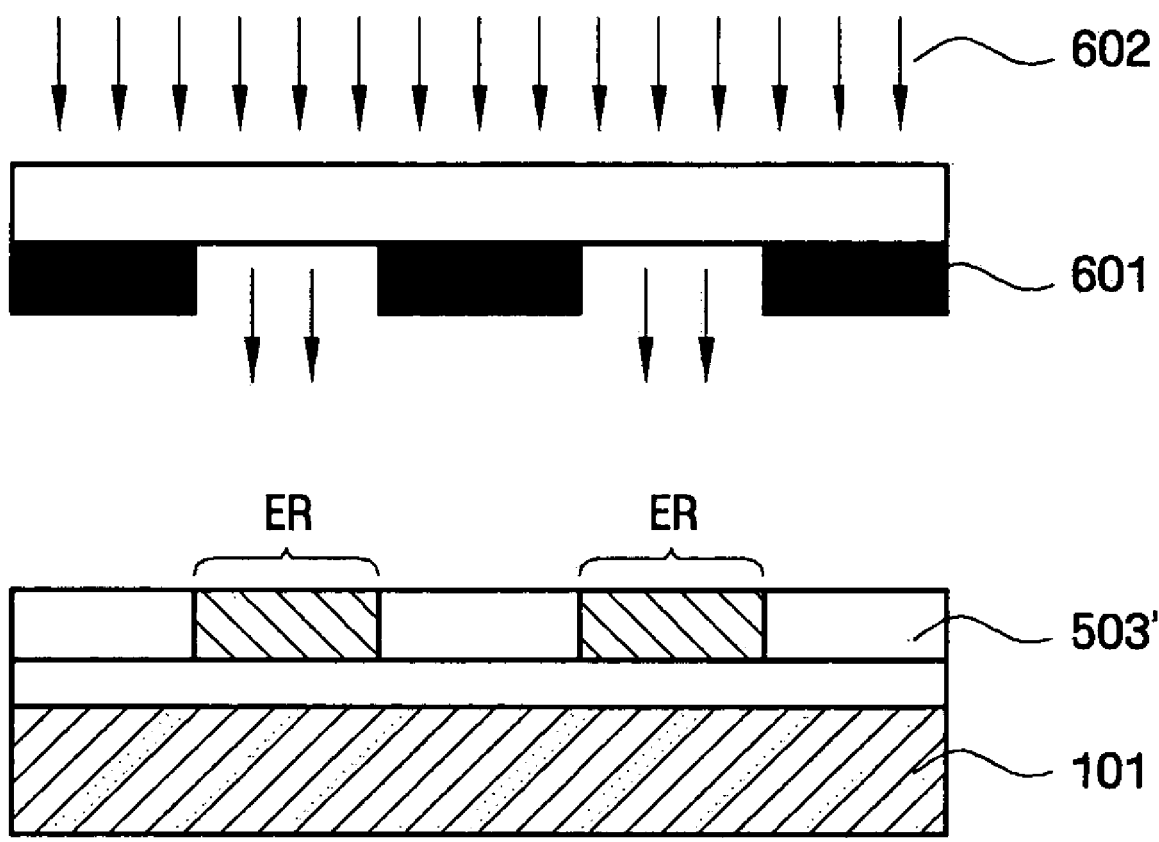
FIG. 6A is a cross-sectional view of a structure resulting from an exposing step in the manufacture of an organic layer pattern according to an embodiment of the invention.

Then, the soft-baked organic layer may be exposed. As shown in FIG. 6A, the organic layer 503' on the substrate 101 may be selectively exposed to light, and specifically to ultraviolet rays 602, using a suitable mask or template 601. As expressed in Reaction scheme 1, a photosensitizer in an exposed region ER of the organic layer 503' is subjected to a photo reaction to be turned to a soluble resin that is to be dissolved in a subsequent developing step:

Reaction Scheme 1

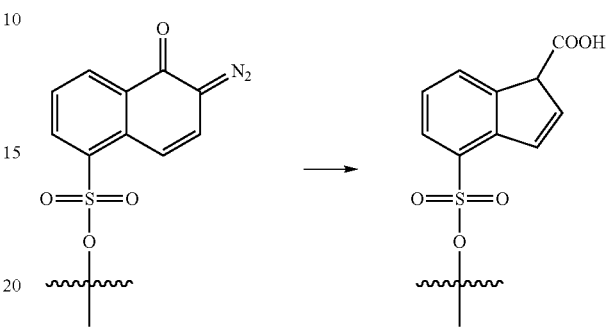

Figure 6B:
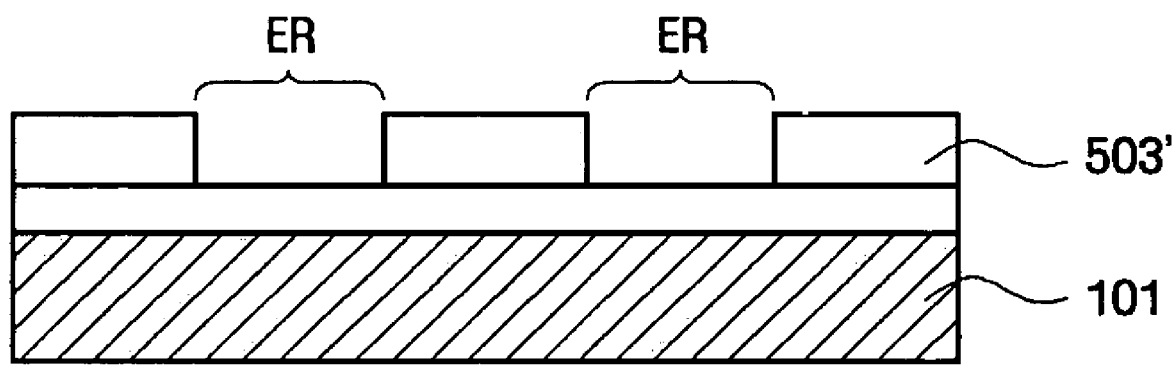
FIG. 6B is a cross-sectional view of a structure resulting from a developing step in the manufacture of the organic layer pattern according to an embodiment of the invention.

As shown in FIG. 6B, the selectively exposed organic layer 503' on the substrate 101 is immersed in an alkali developing solution, and the reaction system is left to stand until the exposed portion of the organic layer 503' is completely or substantially dissolved. Examples of the developing solution used in the invention include, but not limited to, tetramethyl ammonium hydroxide, alkali hydroxide, and ammonium hydroxide.

Figure 6C:
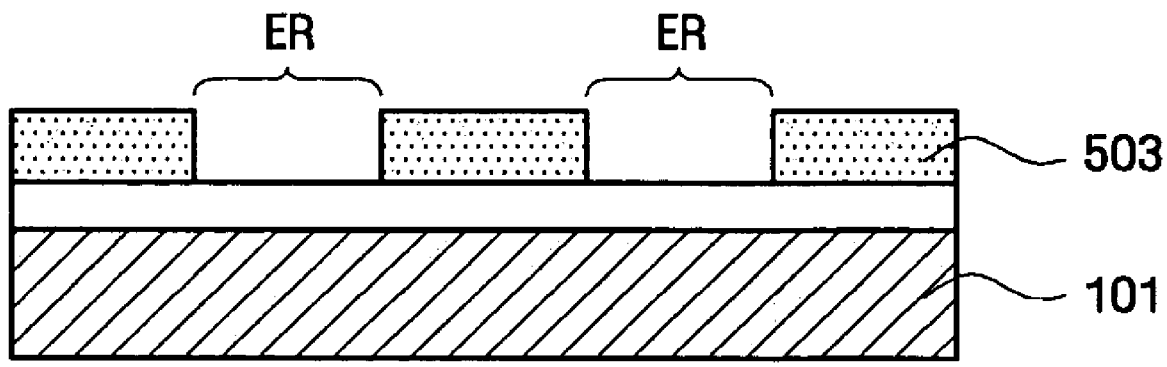
FIG. 6C is a cross-sectional view of a structure resulting from a curing step in the manufacture of the organic layer pattern according to an embodiment of the invention.

Subsequently, as shown in FIG. 6C, the developed substrate 101 is blanket-exposed to I-rays to decompose functional groups absorbing light in a visible light region, and is further annealed to cause a thermal cross-linking reaction, thereby increasing adhesiveness and chemical resistance of the organic layer. During the process, organic polymer resins and the photosensitizer take part in the thermal cross-linking reaction, as expressed in Reaction Scheme 2, thereby forming the insoluble, rigid organic layer pattern 503, which is generally called a curing process.

Reaction Scheme 2

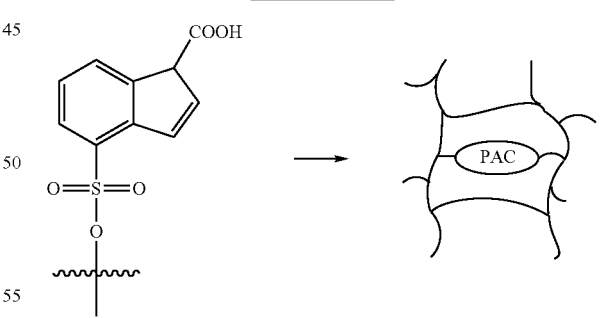

The annealing is performed at a temperature lower than a softening point of the organic layer 503', specifically in a range of about 200° C. to about 250° C. When the annealing is completed, the organic layer pattern 503 having a desired pattern is attained.

As described, the substrate 101 having the organic layer pattern 503 undergoes an etching solution or gas plasma treatment to treat a portion of the substrate 101 exposed by the organic layer pattern 503. Here, an unexposed of the substrate 101 is protected by the organic layer pattern 503.

Unlike in the conventional positive photoresist that is removed by a photolithography process, the organic layer pattern 503 still remains on the substrate 101 even after being patterned, so that it serves to increase an insulating efficiency between various electrodes, enabling a photomask capable of enhancing an aperture ratio of a TFT-LCD to be designed.

EXAMPLES

Specific Example 1

To a reaction basin having an UV shield film and a stirrer are injected 16.7% by weight of organic polymer resin of Formula 1-II, 80% by weight of a mixture of EDM and nBA in a ratio of 90 to 10, 3.3% by weight of a photosensitizer of Formula 6, and 125-1250 ppm of a Si-based surfactant. The resultant product was stirred at room temperature at a speed of 40 rpm to prepare a photoresist composition for the organic layer with a viscosity of 5 cp.

Specific Example 2

A photoresist composition for the organic layer was fabricated in the same manner as described in Example 1 except that 80% by weight of a mixture of EDM and PGMEA mixed in a ratio of 80 to 20 and 500-5000 ppm of a Si-based surfactant were used.

Specific Example 3

A photoresist composition for the organic layer was fabricated in the same manner as described in Example 2 except that 80% by weight of a mixture of EDM and PGMEA mixed in a ratio of 60 to 40 was used.

Specific Example 4

A photoresist composition for the organic layer was fabricated in the same manner as described in Example 2 except that 80% by weight of a mixture of EDM and EEP mixed in a ratio of 80 to 20 was used.

Specific Example 5

A photoresist composition for the organic layer was fabricated in the same manner as described in Example 2 except that 80% by weight of a mixture of EDM and EL mixed in a ratio of 80 to 20 was used.

Specific Example 6

A photoresist composition for the organic layer was fabricated in the same manner as described in Example 1 except that 80% by weight of a mixture of EDM and PGEEA mixed in a ratio of 80 to 20 was used.

Specific Example 7

A photoresist composition for the organic layer was fabricated in the same manner as described in Example 2 except that an organic polymer resin represented by Formula 1-IV was used.

Specific Example 8

A photoresist composition for the organic layer was fabricated in the same manner as described in Example 2 except that an organic polymer resin represented by Formula 1-VI was used.

Specific Example 9

A photoresist composition for the organic layer was fabricated in the same manner as described in Example 2 except that an organic polymer resin represented by Formula 2 (DCPMa/GMA/MAA) was used.

Specific Example 11

A photoresist composition for the organic layer was fabricated in the same manner as described in Example 2 except that 20.7% by weight of an organic polymer resin represented by Formula 1-II and 76% by weight of EDM were used and the viscosity of the obtained composition was 9 cp.

Specific Example 12

A photoresist composition for the organic layer was fabricated in the same manner as described in Example 2 except that 18.7% by weight of an organic polymer resin represented by Formula 1-II and 78% by weight of EDM were used and the viscosity of the obtained composition was 7 cp.

In order to evaluate the performance of organic layers using the compositions prepared in the above-described Examples, including coating uniformity and occurrence of defects, the photoresist compositions for organic layer prepared in Examples 1-12 were coated on 0.7T, that is, 0.7 mm thick, glass substrates having SiNx, Cr, and Mo laminated using a spin-less coating apparatus. Subsequently, the substrates were dried under reduced pressure at room temperature, followed by heating at about 90° C. for about 180 seconds and drying the same, thereby forming an organic layer having a thickness of about 4.90 μm.

Thicknesses of the organic layers according to Examples 1-6 and Examples 11 and 12 were measured, and measurement results thereof, showing MD uniformity and TD uniformity, are listed in Table 1. The measurement was made at 400 points of the substrate, exclusive of 10 mm from the edge of the substrate. Measurement results of the overall coating uniformity of the organic layers according to Examples 1-9 are listed in Table 2. Table 3 shows observation results of defects occurring to the organic layers according to Examples 1-12.

TABLE 1

| | | *MD uniformity (%) | | **TD uniformity (%) | |
|---|---|---|---|---|---|
| | Solvent composition | 10 mm | 15 mm | 10 mm | 15 mm |
| Example 1 | EDM/nBA (90/10) | 3.0 | 3.0 | 4.7 | 2.5 |
| Example 2 | EDM/PGMEA (80/20) | 3.8 | 3.4 | 3.9 | 2.6 |
| Example 3 | EDM/PGMEA (60/40) | 3.2 | 2.8 | 3.2 | 2.6 |
| Example 4 | EDM/EEP (80/20) | 2.5 | 2.1 | 3.5 | 2.8 |
| Example 5 | EDM/EL (80/20) | 2.1 | 2.0 | 2.6 | 2.1 |
| Example 6 | EDM/PGEEA (80/20) | 2.8 | 2.1 | 2.2 | 1.3 |

TABLE 1-continued

|  | Solvent composition | *MD uniformity (%) | | **TD uniformity (%) | |
| --- | --- | --- | --- | --- | --- |
|  |  | 10 mm | 15 mm | 10 mm | 15 mm |
| Example 11 | EDM | 5.1 | 4.1 | 5.8 | 4.7 |
| Example 12 | EDM | 5.0 | 5.0 | 6.5 | 4.5 |

The symbol * indicates a machine direction, which is perpendicular to a direction in which coating is processed on the substrate.
The symbol ** indicates a traveling direction, in which coating is processed on the substrate.

The symbol* indicates a machine direction, which is perpendicular to a direction in which coanting is processed on the substrate. The symbol ** indicates a traveling direction, in which coation is processed on the substrate.

TABLE 2

| | Overall coating uniformity | | Overall coating uniformity |
| --- | --- | --- | --- |
| Example 1 | ○ | Example 2 | ⊚ |
| Example 3 | ⊚ | Example 4 | ⊚ |
| Example 5 | ⊚ | Example 6 | ⊚ |
| Example 7 | ○ | Example 8 | ○ |
| Example 9 | ○ | | |
| Example 11 | Δ | Example 12 | Δ |

⊚: Very good,
○: Good,
Δ: Average

As shown in Tables 1 and 2, when the photoresist compositions for the organic layer according to Examples 1-9 were coated on the substrate using the spin-less coating apparatus to form organic layers, they were very good in the overall coating uniformity. On the other hand, the organic layers according to Examples 11 and 12 were poor in the overall coating uniformity compared to the organic layers according to Examples 1-9.

TABLE 3

| | Evaluation of detects generated | | Evaluation of detects generated |
| --- | --- | --- | --- |
| Example 1 | ○ | Example 2 | ⊚ |
| Example 3 | ⊚ | Example 4 | ○ |
| Example 5 | ⊚ | Example 6 | ○ |
| Example 7 | ○ | Example 8 | ○ |
| Example 9 | ○ | | |
| Example 11 | Δ | Example 12 | Δ |

⊚: Very good,
○: Good,
Δ: Average

As shown in Table 3, when defects occurring to organic layers according to Experimental Examples 1-12 were compared to each other, it was understood that the organic layers according to Examples 1-9 had fewer defects than those according to Examples 11 and 12.

As described above, according to the invention, the photoresist composition for the organic layer can be coated on a large-scale substrate to a uniform thickness by a spin-less coating method, and generation of defects can be minimized. Therefore, several processing steps, such as EBR, which have been conventionally performed for the purpose of removing conglomerate of an organic layer, are not necessary, thereby shortening a processing time, reducing the photoresist composition for the organic layer used, which is quite an expensive material, improving thickness characteristics of the organic layer, and ultimately reducing the manufacturing cost.

In addition, forming the organic layer pattern using a photoresist composition for organic layer, preceded by passivation of SiNx or SiOx in the manufacture of TFTs, can improve a line width of a circuit and an aperture ratio, thereby offering high-resolution, high-brightness liquid crystal displays.

What is claimed is:

1. A photoresist composition for an organic layer of a liquid crystal display, comprising:
    an organic polymer resin having an average molecular weight in the range of about 2,000 to about 20,000;
    a mixed solvent of ethylene diglycol methylethyl ether (EDM) and a solvent having a vapor pressure lower than the EDM; and
    a photosensitizer, wherein the organic polymer resin is present in an amount in the range of about 5% to about 30% by weight, the mixed solvent is present in an amount in the range of about 60% to about 90% by weight, and the photosensitizer is present in an amount in the range of about 2% to about 10% by weight based on the weight of the photoresist composition.

2. The photoresist composition of claim 1, wherein the ethylene diglycol methylethyl ether (EDM) is mixed with the solvent having a vapor pressure lower than the EDM in a ratio in a range of about 50-95 to about 50-5.

3. The photoresist composition of claim 2, wherein the solvent having a vapor pressure lower than the EDM comprises at least one selected from the group consisting of an acetate-based solvent, a lactate-based solvent, a propionate-based solvent, and an ether-based solvent.

4. The photoresist composition of claim 3, wherein the acetate-based solvent comprises at least compound selected from the group consisting of propyleneglycol methyl ether acetate (PGMEA), propyleneglycol monomethyl ether acetate (PGMEEA), methoxy butyl acetate (MBA), n-propyl acetate (nPAC), and n-butyl acetate (nBA).

5. The photoresist composition of claim 3, wherein the acetate-based solvent is selected from the group consisting of propylene glycol methyletheracetate (PGMEA), propylene glycol monoethyletheracetate (PGEEA) or methoxybutylacetate (MBA).

6. The photoresist composition of claim 3, wherein the lactate-based solvent is ethyl lactate (EL).

7. The photoresist composition of claim 3, wherein the propionate-based solvent comprises at least one selected from the group consisting of ethyl-beta-ethoxypropionate (BEP), and methyl-3-methoxypropionate (MMP).

8. The photoresist composition of claim 7, wherein the propionate-based solvent is ethyl-beta-ethoxypropionate (EEP).

9. The photoresist composition of claim 3, wherein the ether-based solvent is propylene glycol monomethyl ether (PGME).

10. The photoresist composition of claim 1, wherein the organic polymer resin is selected from the group consisting of an organic polymer resin represented by Formula 1, an organic polymer resin represented by Formula 2, and mixtures thereof:

[Formula 1]

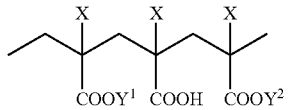

wherein X is a hydrogen atom or a methyl group, $Y^1$ is an alkyl or hydroxyalkyl group of about 2 to about 16 carbon atoms, $Y^2$ is at least one selected from the group consisting of compounds represented by Formulas (I)-(XIX):

Formula I

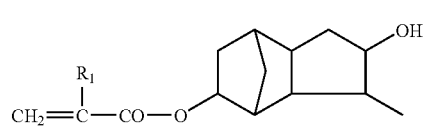

Formula II

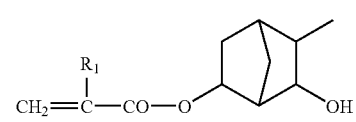

Formula III

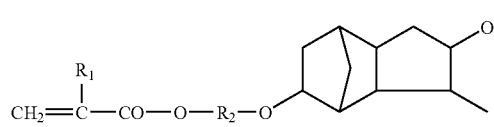

Formula IV

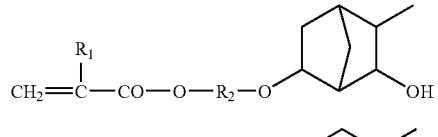

Formula V

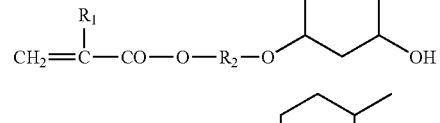

Formula VI

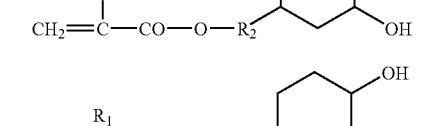

Formula VII

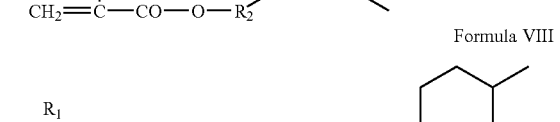

Formula VIII

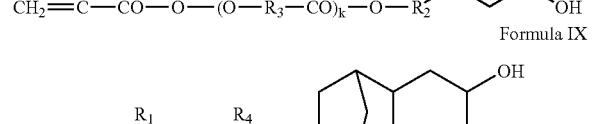

Formula IX

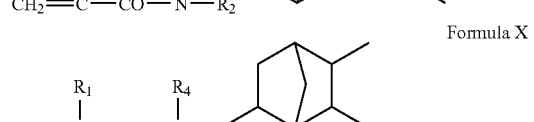

Formula X

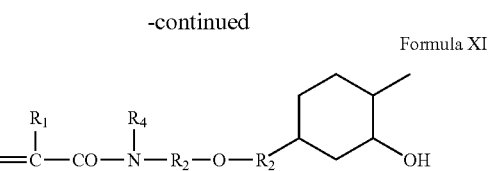

-continued

Formula XI

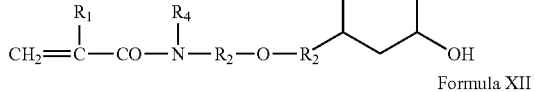

Formula XII

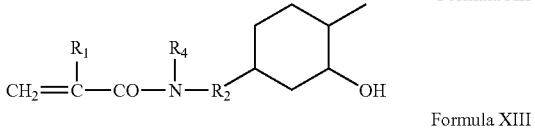

Formula XIII

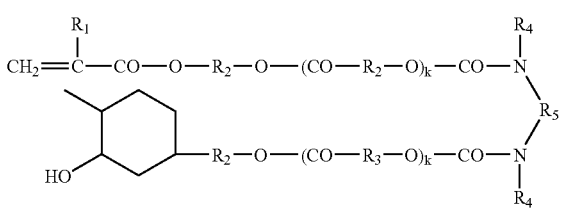

Formula XIV

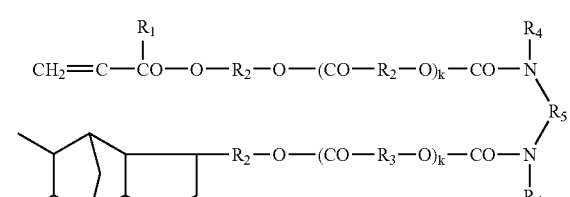

Formula XV

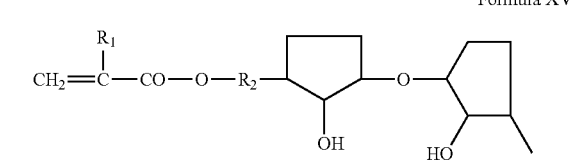

Formula XVI

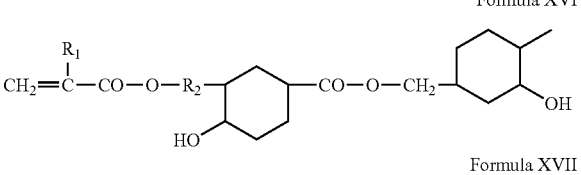

Formula XVII

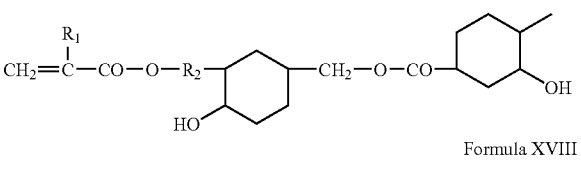

Formula XVIII

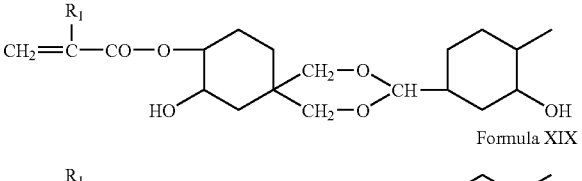

Formula XIX

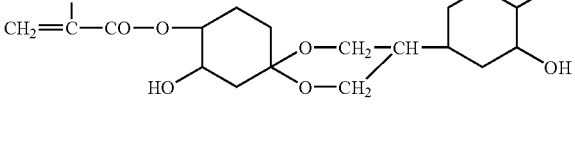

wherein $R_1$ is a hydrogen atom or a methyl group, $R_2$ is an alkylene group of about 1 to about 10 carbon atoms, $R_3$ is a hydrocarbon residual group of about 1 to about 10 carbon atoms, $R_4$ is a hydrogen atom or a methyl group, $R_5$ is an alkylene group of about 1 to about 10 carbon atoms, and k is an integer in the range of about 0 to about 10

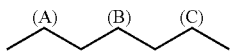

Formula 2 wherein the polymerization unit A is selected from the group consisting of benzyl methacrylate (BZMA), styrene (Sty), a-methyl styrene, and isobomyl acrylate, or A is at least one selected from the group consisting of isobomyl methacrylate (IRMA), dicyclopentanyl acrylate, dicyclopentanyl methacrylate (DCPMa), dicyclopentenyl acrylate, dicyclopentenyl methacrylate, dicyclopentanylethyloxy acrylate, dicyclopentanylethyloxy methacrylate, dicyclopentenylethyloxy acrylate, and dicyclopentenylethyloxy methacrylate, B is at least one selected from the group consisting of glycidyl methacrylate (GMA), hydroxyethyl methacrylate (LiEMA), diniethylanuino methacrylate, and acryl aniide (ACAMi), C is acrylic acid (AA) or methacrylic acid (MAA), and wherein the binder resin includes random copolymers which are not affected by a sequence in which the polymerization units A, B and C.

11. The photoresist composition of claim 1, wherein the photosensitizer is at least one selected from the group consisting of compounds represented by Formulas 4-6:

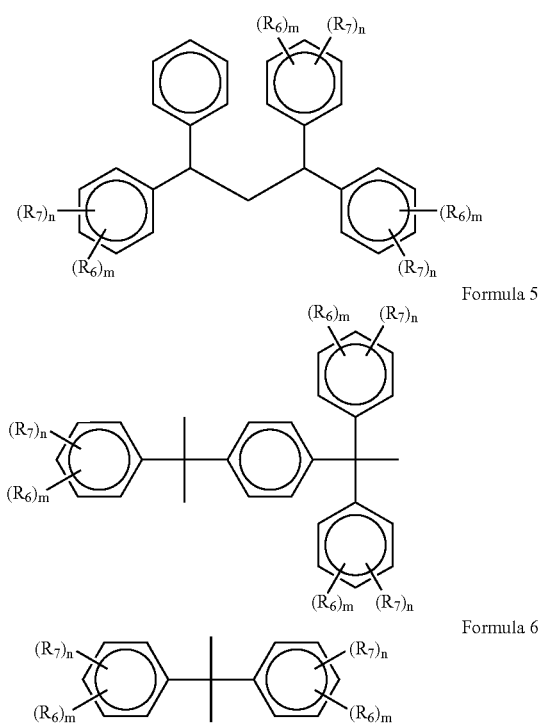

wherein $R_6$ is diazonaphthoquinone sulfonic ester (DMQ), $R_7$ is a hydrogen atom, a hydroxy group, or a methyl group, m and n are independently 1 to 4, the diazonaphthoquinone sulfonic ester (DMQ) is represented by structural formula:

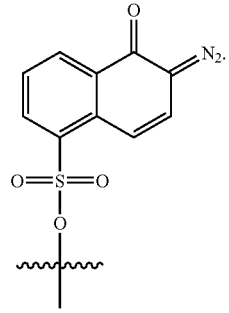

12. The photoresist composition of claim 1, wherein the photoresist composition for organic layer further comprises about 500 ppm to about 5,000 ppm of a Si-based surfactant.

13. The photoresist composition of claim 1, wherein the photoresist composition for organic layer has a viscosity in the range of about 1 cp to about 15 cp.

14. A method for spin-less coating an photoresist composition for organic layer of a liquid crystal display, comprising:
supplying the photoresist composition of claim 1 to a nozzle of a spin-less coating apparatus; and
spin-lessly coating the photoresist composition on the substrate by moving the nozzle relative to the substrate while discharging the photoresist composition through the nozzle.

15. The spin-less coating method of claim 14, wherein the nozzle extends along one side of the substrate, and has a plurality of discharge portions formed therein.

16. The spin-less coating method of claim 15, wherein a barrier is formed between each of the plurality of discharge portions.

17. The spin-less coating method of claim 15, wherein one of the plurality of discharge portions comprises a supply duct connected to means for supplying the photoresist composition, a storage portion in which the photoresist composition fed from the supply duct is stored, a passage connected to a bottom surface of the storage portion, and a slit portion connected to the passage.

18. A method of fabricating an organic layer pattern, comprising:
forming an organic layer by spin-lessly coating the photoresist composition of claim 1 on
a substrate; and
patterning the organic layer.

19. The method of claim 18, wherein the substrate is a substrate having a thin film transistor structure.

20. The method of claim 18, wherein the patterning comprises: drying the organic layer on the substrate under reduced pressure; soft-baking the dried organic layer; selectively exposing the soft-baked organic layer; developing the exposed organic layer; and curing the developed organic layer to complete the organic layer pattern.

21. The method of claim 20, wherein the drying step comprises pre-pumping and main-pumping, wherein the main pumping has a pressure lower than the pre-pumping.

22. The method of claim 20, wherein the soft-baking is performed at a temperature in a range of about 80° C. to about 120° C.

23. The method of claim 20, wherein the curing comprises blanket-exposing and annealing.

24. The method of claim 23, wherein the annealing is performed at a temperature in a range of about 200° C. to about 250° C.

* * * * *